(12) United States Patent
Feil et al.

(10) Patent No.: US 6,515,453 B2
(45) Date of Patent: Feb. 4, 2003

(54) METHOD OF PREDICTING THE STATE OF CHARGE AS WELL AS THE USE TIME LEFT OF A RECHARGEABLE BATTERY

(75) Inventors: Hans Feil, Eindhoven (NL); Hendrik Johannes Bergveld, Eindhoven (NL); Johann Reiner Godefridus Cornelis Maria Van Beek, Eindhoven (NL)

(73) Assignee: Koninklijke Philips Electronics, Eindhoven (NL)

( * ) Notice: Subject to any disclaimer, the term of this patent is extended or adjusted under 35 U.S.C. 154(b) by 0 days.

(21) Appl. No.: 10/015,721

(22) Filed: Nov. 30, 2001

(65) Prior Publication Data

US 2002/0117997 A1 Aug. 29, 2002

(30) Foreign Application Priority Data

Nov. 30, 2000 (EP) .............................................. 00204262

(51) Int. Cl.⁷ ................................................ H02J 7/00
(52) U.S. Cl. ...................................... 320/132; 320/130
(58) Field of Search ................................. 320/132, 130, 320/136, 144, 134, DIG. 21; 324/426, 427, 425, 432

(56) References Cited

U.S. PATENT DOCUMENTS

| 4,021,718 A | * | 5/1977 | Konrad ................. 320/DIG. 21 |
| 5,631,540 A | | 5/1997 | Nguyen ........................ 320/30 |
| 6,388,447 B1 | * | 5/2002 | Hall et al. ................... 324/426 |

* cited by examiner

Primary Examiner—Edward H. Tso
Assistant Examiner—Lawrence Luk

(57) ABSTRACT

Disclosed is a method of estimating the state of charge of a rechargeable lithium battery. The first step of said method is to determine whether the battery is in an equilibrium state or in a non-equilibrium state. If the battery is determined to be in an equilibrium state, the voltage across the battery is measured and converted into an equilibrium state-of-charge value. If the battery is in a non-equilibrium state, the charge withdrawn from or supplied to the battery is calculated by means of current integration, and this charge is subtracted from or added to a state-of-charge value calculated earlier.

Figure 1:
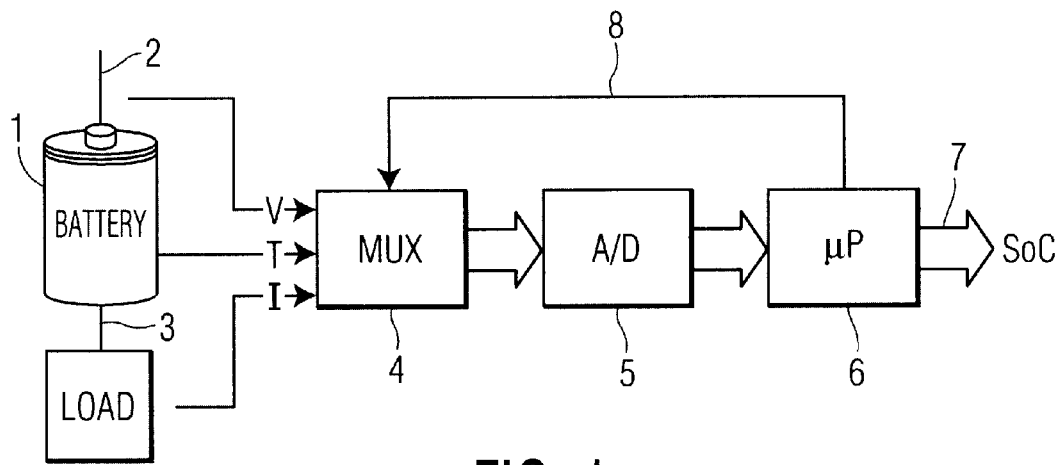

Also disclosed is a method of estimating the time that an application can be used under predefined conditions.

10 Claims, 1 Drawing Sheet

METHOD OF PREDICTING THE STATE OF CHARGE AS WELL AS THE USE TIME LEFT OF A RECHARGEABLE BATTERY

TECHNICAL FIELD

The present invention relates to a method of predicting the state of charge of a rechargeable battery, in particular a rechargeable lithium battery. Moreover, the present invention relates to a use time left system, which calculates and indicates the time that an application can be used under predefined conditions.

BACKGROUND AND SUMMARY OF THE INVENTION

U.S. Pat. No. 5,631,540 relates to a method and apparatus for predicting the remaining capacity and reserve time of a battery on discharge. According to said patent, the remaining battery capacity is determined from the difference between the battery full charge open circuit voltage and the voltage loss due to internal resistance of the battery minus battery voltage on discharge divided by the battery temperature, which is the temperature-corrected battery overvoltage. The remaining reserve capacity of the battery is subsequently determined by the ratio of the remaining reserve capacity calculated earlier to a maximum theoretical capacity as an exponential function.

An important disadvantage of the above method is that the calculated remaining battery capacity will eventually drift away from the real value owing to inter alia measurement inaccuracies. This results in an inaccurate prediction of the remaining capacity and reserve time of the battery.

The present invention aims to provide a method of predicting the state of charge of a rechargeable battery which provides an accurate measurement of the remaining capacity of the battery.

To this end, the present invention provides a method of predicting the state of charge of a rechargeable battery, in particular a lithium battery, comprising the steps of:

determining whether the battery is in an equilibrium state or in a non-equilibrium state; and if the battery is in an equilibrium state, measuring the voltage across the battery and converting this measured voltage into an equilibrium state-of-charge value;

if the battery is in a non-equilibrium state, calculating the charge withdrawn from or supplied to the battery by means of current integration, and subtracting this charge from or adding it to a state-of-charge value calculated earlier.

The battery is said to be in the equilibrium state if only a very small amount of current is drawn from or supplied to the battery. The absolute value of said current is lower than a defined small current $I_{lim}$. This situation occurs, for example, when a mobile phone is in the standby mode. In such a case the current drawn from the battery is only a few mA.

The non-equilibrium state comprises the charge state, the discharge state and the transition state. In the charge state, a positive current larger than the defined $I_{lim}$ is flowing into the battery. In the discharge state, a negative current larger than the defined $I_{lim}$ in absolute value is flowing out of the battery. The transition state is the state in which either the charge state or discharge state changes to the equilibrium state.

A more accurate measurement of the state-of-charge is achieved in that a distinction is made between the calculation of the state of charge in the equilibrium state and in the non-equilibrium state of the battery.

The measured voltage across the battery in the equilibrium state is converted into an equilibrium state-of-charge value in particular through the use of a stored characteristic voltage versus state of charge curve, preferably the EMF curve.

As in the equilibrium state only a small amount of current flows from the battery, the measured voltage approaches the EMF of the battery. This EMF equals the sum of the equilibrium potentials of the electrodes of the battery. The method according to the present invention is based on an algorithm which uses a stored EMF versus state of charge curve to translate the voltage value measured in the equilibrium state into a state-of-charge value, expressed as an percentage of the maximum capacity.

The EMF versus state of charge curve remains the same, even when the battery ages. Moreover, the temperature dependence of this curve is relatively low. Thus the EMF curve is suitable for use as a calibration of the state-of-charge system, because the same state-of-charge is found for a certain measured EMF value, irrespective of the age and temperature of the battery. This calibration is important because in the non-equilibrium states the calculated state of charge will eventually drift away from the real value owing to, for example, inaccuracies in current measurement and the integration in time of said inaccuracies.

Since the method of estimating the state of charge comprises a calibration step in the equilibrium state, it is important that in said state the voltage actually does approach the EMF of the battery. Therefore, the algorithm is only allowed to enter the equilibrium state when a steady-state situation has been reached, in which the battery voltage is close to or substantially equals the EMF.

In the non-equilibrium state the charge withdrawn from or supplied to the battery is calculated by means of current integration, and this charge is subtracted from or added to a state-of-charge value calculated earlier. This method is also called Coulomb counting.

In particular, the state-of-charge value calculated earlier may be the initial state-of-charge value or a previous equilibrium state-of-charge value.

The algorithm according to the method of the invention operates in five states, these being the initial state, the equilibrium state, the charge state, the discharge state and the transition state—the latter three being the non-equilibrium states. The algorithm starts up in the initial state and determines the initial state of charge.

Advantageously, the initial state-of-charge value is obtained by measuring the voltage across the battery in the initial state and converting this measured voltage into an initial state state-of-charge value.

Dependent on whether the battery is charged, discharged or in equilibrium, the algorithm then shifts to the appropriate state and determines the state-of-charge by voltage measurement or by Coulomb counting.

The present invention also relates to a method of predicting the time that an application can be used under predefined conditions, the so-called time left. Said method comprises the steps of:

determining the state of charge of the battery according to the method of the present invention as disclosed in the above; and calculating the battery voltage as the sum of the equilibrium voltage and the overpotential.

The voltage of a battery during discharging is lower than the equilibrium voltage. This is due to the overpotential. A distinction should be made between the available charge in the battery and the charge that can be withdrawn from the battery under certain conditions. Especially at low temperatures and at a low state of charge, the remaining charge cannot be withdrawn from the battery owing to a high overpotential, because the battery voltage will drop below the so-called end-of-discharge voltage $V_{min}$ defined in the portable device.

A battery is considered empty when the voltage drops below a certain level $V_{min}$. For example, in mobile telephone terminology, "talk time left" refers to the time it takes until the voltage drops below $V_{min}$ while the telephone is continuously in the talk mode. "Standby time left" refers to the time it takes until the voltage drops below $V_{min}$ while the telephone is continuously in the standby mode.

Advantageously, the overpotential is calculated from a function having at least a time-dependent part. Preferably, the overpotential is calculated from a function at least comprising a capacity-dependent part.

In order to predict the battery voltage, it is necessary to know the state of charge of the battery and to calculate the overpotential as a function of time and the state of charge.

In particular, the overpotential is calculated from a function having at least a temperature-dependent part.

Such a temperature dependence allows to determine the use time left under different temperature conditions, for example the use time left at room temperature as well as the use time left at zero degrees Celsius. In the calculations, the standby time-left and talk time left can also be taken into account, resulting in an indication of standby time left at two different temperatures, for example at room temperature and at a temperature of zero degrees Celsius, and an indication of talk time left at two different temperatures.

In the non-equilibrium state, the state of charge of a battery is calculated by means of Coulomb counting. The overpotentials are calculated in a differential form, as shown in equations 7 to 12 represented below. Both the overpotentials and the Coulomb counting are reset in the equilibrium state.

In particular, the overpotential is calculated from a function having at least one term which is inversely related to the remaining capacity of the battery.

Finally, the present invention relates to an electronic network model of a rechargeable battery comprising at least one RC circuit wherein the values of the resistor and the capacitor are related to a time-dependent part of the overpotential of the battery, at least two resistors, the value of one resistor being related to the remaining capacity of the battery which corresponds to the overpotential, and a voltage source whose value is related to the remaining capacity of the battery which corresponds to the equilibrium voltage.

In particular, the value of one or more of the components in the electronic network has a temperature dependence.

In order to achieve maximum accuracy, the values of all components in the electronic network are dependent on the remaining capacity of the battery.

In particular, the value of one of the resistors depends on the direction of the current. Higher accuracy may be obtained if also this resistor is connected in parallel with a capacitor in order to simulate the time dependence of this particular process.

BRIEF DESCRIPTION OF THE DRAWING FIGURES

Figure 2:
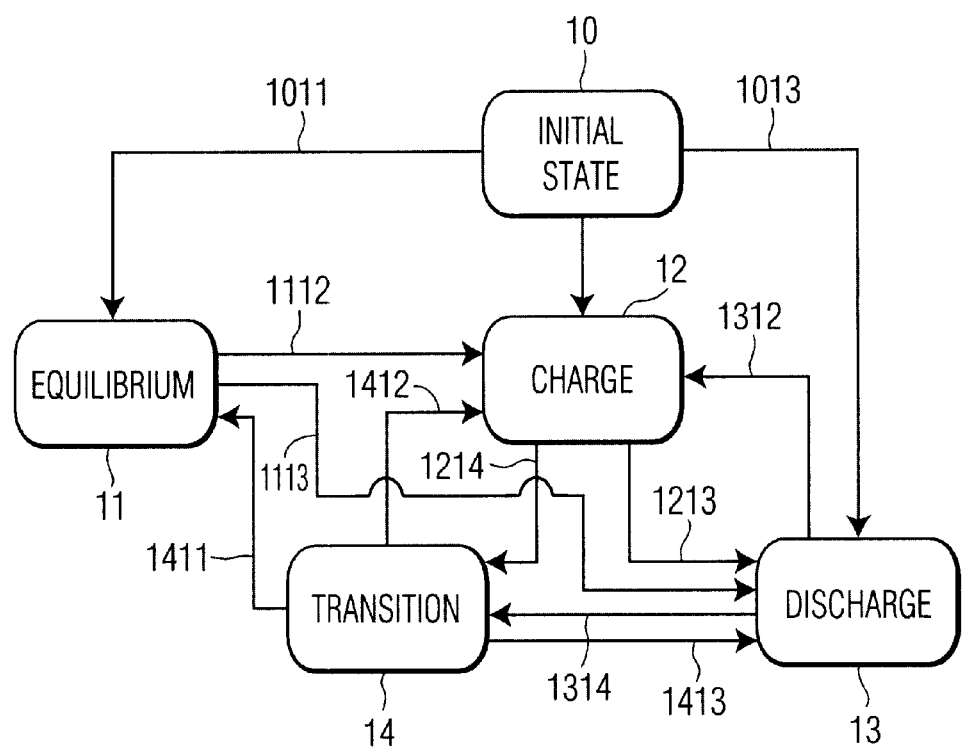

The present invention will be further illustrated by means of the accompanying drawings, in which:

FIG. 1 is a block diagram showing an example of the state-of-charge indication system; and FIG. 2 is a state diagram for a rechargeable battery indicating relative current levels between each state.

DETAILED DESCRIPTION

In FIG. 1, a state-of-charge (SoC) system is diagrammatically illustrated for a rechargeable battery 1. The voltage V between the terminals 2 and 3 of a battery 1 is measured together with the current I flowing to or from the battery and with the temperature T of the immediate environment. These measurement data V, I, T are handled sequentially by a multiplexer 4 and an analog-to-digital (A/D) converter 5 and supplied to a microprocessor 6. The microprocessor applies the appropriate algorithm according to the invention and generates an estimated SoC signal at output 7. The microprocessor 6 also controls the multiplexer 4 by means of the feedback loop 8 and thus determines whether the voltage V, the current I or the temperature T is sampled at any particular time, in dependence on the determined state of the battery and other factors.

FIG. 2 is a state diagram of the state-of-charge algorithm used by the microprocessor 6 of FIG. 1 to assess the state of the rechargeable battery 1. The possible states are represented by boxes 10 to 14:

10: initial state—when the battery is first connected.
11: equilibrium state—very little current drawn from or supplied to the battery.
12: charge state—large current flowing to the battery.
13: discharge state—large current flowing from the battery.
14: transition state—when the algorithm is changing from charge or discharge to equilibrium.

When the battery is first connected to the SoC system, the algorithm will start up in the initial state and determine the initial SoC. The algorithm will subsequently shift to the charge, discharge or equilibrium state, as appropriate. This is done by measuring the current I and comparing it with a predetermined, relatively low current value $I_{lim}$. If I is a positive current, i.e. flowing into the battery, and is greater than $I_{lim}$, then the battery is determined to be in the charge state and the algorithm shifts to box 12. If I is a negative current, i.e. flowing from the battery, and is greater than $I_{lim}$, then the battery is determined to be in the discharge state and the algorithm shifts to box 13.

If I is smaller than or equal to $I_{lim}$, the battery is supposed to be in the equilibrium or near-equilibrium state. However, relaxation processes occur in rechargeable batteries when the current changes to a value smaller than $I_{lim}$, and these relaxation processes affect the battery voltage. Hence, according to the invention, the microprocessor 6 additionally looks for a steady voltage state when I is smaller than $I_{lim}$ before it moves the algorithm to the equilibrium state 11.

In the equilibrium state the SoC is estimated and is used for calibrating the system, i.e. is used as a reference for the microprocessor 6. The calibration is important because the calculated SoC in non-equilibrium states tends to drift away from the real value owing to measurement inaccuracies in the current and the integration with time of these inaccuracies. To ensure a correct calibration, it is important to the invention to ensure that a steady-state equilibrium has been attained, i.e. that the relaxation processes have run their course, because in that case the measured voltage is much closer to the true EMF of the battery. The microprocessor algorithm assumes that the voltage is close to the EMF and uses it in combination with a stored EMF-versus-SoC data table in order to translate the measured voltage into an SoC value expressed as a percentage of the maximum capacity for display.

This system has the advantage that the EMF-versus-SoC relationship remains substantially the same even when the battery ages and is also substantially temperature independent.

If a steady-state voltage is not detected, the algorithm will not enter the equilibrium state and accurate calibration is safeguarded.

A steady state voltage is also checked before the algorithm moves from either the charge state 12 or the discharge state 13 to the equilibrium state 11. The algorithm accordingly provides a transition state 14 wherein the voltage is monitored for stability. Thus if the current in the charge state 12 or in the discharge state 13 changes so as to become smaller than or equal to zero, as indicated by line 1214 and line 1314, respectively, in FIG. 2, the algorithm will move to the transition state 14 and check for a stable voltage. When the voltage is stable, the algorithm passes to the equilibrium state 11 indicated by line 1411.

In the transition state 14, the current I is also measured. If I changes again so as to become greater than $I_{lim}$, the algorithm moves to the charge state 12 again. If, on the other hand, I changes so as to become negative and in absolute value greater than $I_{lim}$, then the algorithm moves to the discharge state 13. This is indicated by lines 1412 and 1413, respectively.

Similarly in the equilibrium state 11, the current I is constantly monitored and the algorithm is accordingly moved to the appropriate state as shown by lines 1112 (back to charge state 12) and 1113 (back to discharge state 13).

In summary, the SoC is determined by current measurement in the charge, discharge and transition states, and a calibration SoC is determined by a steady-state voltage measurement in the equilibrium state. The current measurement in the charge, discharge and transition states is integrated over time and subtracted from or added to the calibration SoC calculated in the equilibrium state 11 or to the initial SoC.

Further compensation is applied in the discharge state 13 because the effect of overpotential must be taken into account: the battery voltage is lower than the EMF during discharge. Overpotentials are temperature dependent and the microprocessor 6 will accordingly access a temperature reading via the multiplexer 4 as and when appropriate.

The use time left is estimated from the battery voltage, but below a certain minimum $V_{min}$ in the battery is considered empty anyway. This minimum is typically 3 V for current mobile phones. Thus the use time is that time which is required for the voltage to drop to $V_{min}$. The battery voltage is estimated from the SoC, but overpotentials which vary as a function of time and of the SoC must also be taken into account for an accurate value to be calculated, because the battery voltage during discharging is lower than the equilibrium voltage owing to said overpotentials.

Equation 1 gives the battery voltage as the sum of the EMF and the overpotential:

$$V_{batt}(q,T,I,t) = V_{EMF}(q) + \eta(q,T,I,t) \quad (1)$$

The overpotential can be approximated by equation 2 as the sum of the overpotential due to ohmic resistances, due to charge transfer and double layer resistances, due to electrolyte diffusion/migration, and due to solid-state diffusion. Equations for each of these contributions to the overpotential are given in equations 3, 4, 5 and 6, respectively.

$$\eta(q,T,I,t) = \eta_{ohm}(T,I,t) + \eta_{ct}(T,I,t) + \eta_{diff}(T,I,t) + \eta_q(q,T,I,t) \quad (2)$$

$$\eta_{ohm}(T,I,t) = I(t) R_{ohm}(T) \quad (3)$$

$$\eta_{ct}(T,I,t) = I(t) R_{ct}(T)\left[1 - \exp\left(\frac{-t}{R_{ct}(T) C_{dl}(T)}\right)\right] \quad (4)$$

$$\eta_{diff}(T,I,t) = I(t) R_{diff}(T)\left[1 - \exp\left(\frac{-t}{R_{diff}(T) C_{diff}(T)}\right)\right] \quad (5)$$

$$\eta_q(q,T,I,t) = I(t) R_q(T)\left[\frac{1}{(q_{max} - q)}\right] \quad (6)$$

In equations 7 to 12, the overpotentials are written in differential form, and in this form the overpotentials can be calculated when the battery is in non-equilibrium states.

$$\eta(q,T,I,t+dt) = \eta(q,T,I,t) + d\eta(q,T,I,t) \quad (7)$$

$$d\eta(q,T,I,t) = d\eta_{ohm}(T,I,t) + d\eta_{ct}(T,I,t) + d\eta_{diff}(T,I,t) + d\eta_q(q,T,I,t) \quad (8)$$

$$d\eta_{ohm}(T,I,t) = (I(t+dt) - I(t)) R_{ohm} \quad (9)$$

$$d\eta_{ct}(T,I,t) = (I(t+dt) R_{ct} - \eta_{ct})\left[1 - \exp\left(\frac{-t}{R_{ct} C_{dl}}\right)\right] \quad (10)$$

$$d\eta_{diff}(T,I,t) = (I(t+dt) R_{diff} - \eta_{diff})\left[1 - \exp\left(\frac{-t}{R_{diff} C_{diff}}\right)\right] \quad (11)$$

$$d\eta_q(q,T,I,t) = \frac{R_q}{q}(I(t+dt) - I(t)) - dt\left(\frac{\eta_q^2}{R_q}\right) \quad (12)$$

Once the overpotential is found, the use time can be calculated for any given condition of temperature T and current I. In the non-equilibrium states, the SoC of a battery is calculated by means of Coulomb counting. The overpotentials are calculated in a differential form as shown in the above. Both the overpotentials and the Coulomb counting are reset in the equilibrium state.

What is claimed is:

1. A method of estimating the state-of-charge for a rechargeable lithium battery, comprising the steps of:
   determining whether the battery is in an equilibrium state or in a non-equilibrium state; and
   if the battery is in an equilibrium state, measuring the voltage across the battery and converting this measured voltage into an equilibrium state-of-charge value;
   if the battery is in a non-equilibrium state, calculating the charge withdrawn from or supplied to the battery by means of current integration, and subtracting this charge from or adding it to a state-of-charge value calculated earlier.

2. A method as claimed in claim 1, characterized in that in the equilibrium state the measured voltage across the battery is converted into an equilibrium state-of-charge value using a stored characteristic voltage versus state of charge curve.

3. A method as claimed in claim 2, characterized in that the stored characteristic voltage versus state of charge curve comprises the EMF curve.

4. A method as claimed in claim 1, characterized in that the state-of-charge value calculated earlier may be the initial state-of-charge value or a previous equilibrium state-of-charge value.

5. A method as claimed in claim 4, characterized in that the initial state-of-charge value is obtained by measuring the voltage across the battery in the initial state and converting this measured voltage into an initial-state state-of-charge value.

6. A method of estimating the time that an application can be used under predefined conditions, said method comprising the steps of determining the state of charge of the battery as claimed in claim 1; and calculating the battery voltage as the sum of the equilibrium voltage and the overpotential.

7. A method as claimed in claim 6, characterized in that the overpotential is calculated from a function having at least a time-dependent part.

8. A method as claimed in claim 6, characterized in that the overpotential is calculated from a function having at least a temperature-dependent part.

9. A method as claimed in claim 6, characterized in that the overpotential is calculated from a function at least comprising a capacity-dependent part.

10. A method as claimed in claim 6, characterized in that the overpotential is calculated from a function having at least one term which is inversely related to the remaining capacity of the battery.

* * * * *